United States Patent [19]

Martin

[11] Patent Number: 4,959,617
[45] Date of Patent: Sep. 25, 1990

[54] DUAL STATE PHASE DETECTOR HAVING FREQUENCY STEERING CAPABILITY

[75] Inventor: Frederick L. Martin, North Lauderdale, Fla.

[73] Assignee: Motorola, Inc., Schaumburg, Ill.

[21] Appl. No.: 357,912

[22] Filed: May 30, 1989

[51] Int. Cl.⁵ .................. H03K 9/06; H03D 13/00
[52] U.S. Cl. .................................. 328/133; 328/104; 328/137; 328/155; 307/514; 307/262
[58] Field of Search ............... 328/133, 134, 61, 104, 328/63, 72, 154, 155; 307/479, 480, 243, 269, 511, 514, 271, 262; 331/49

[56] References Cited

U.S. PATENT DOCUMENTS

| | | | |
|---|---|---|---|
| 4,499,425 | 2/1985 | Maas | 328/134 |
| 4,712,060 | 12/1987 | Bailey et al. | 328/133 |
| 4,868,513 | 9/1989 | Piercy et al. | 328/134 |

*Primary Examiner*—Timothy P. Callahan
*Attorney, Agent, or Firm*—Robert S. Babayi

[57] ABSTRACT

A digital phase detector for providing an output characterized by the phase difference of a first input signals and a second input signal is provided. The phase detector comprises a first and a second dual state phase detector, each providing an output having a duty cycle corresponding to the phase difference of the input signals. The phase detectors operate linearly for a range of 360 degrees of phase difference, and provide a signal when the phase diference between the two input signals has exceeded the 360 degree range. The first phase detector provides the phase difference of the first and second input signals, while the second phase detector provides the phase difference between the second and the inverse of the first input signal. The output of the phase detector of the invention is provided by the phase detector having the phase difference within the 360 degree range.

6 Claims, 3 Drawing Sheets

DUAL STATE PHASE DETECTOR HAVING FREQUENCY STEERING CAPABILITY

TECHNICAL FIELD

This invention relates generally to the field of phase detectors and, particularly to binary dual state phase detectors.

BACKGROUND ART

Frequency synthesizers having phase lock loops (PLL) are widely utilized in electronic systems. Particularly, in communication systems frequency synthesizers provide an advantage in reducing the circuitry required to transmit and receive signals on different frequencies. Such digital phase lock loops are well known in the art. Digital PLLs may be used for generating a number of frequencies from a reference frequency, by simply changing a dividing factor.

A significant parameter when considering a synthesizer system is its lock time. The lock time is the amount of time elapsed before the PLL is locked from one frequency to another frequency. A PLL having wider loop bandwidth generally provides faster lock time. The frequency resolution of the PLL is another important parameter to consider, and is determined by the reference frequency having an integer divider. For example a 5 KHz reference frequency provides a 5 KHz frequency resolution per divider step. One method to widen the loop bandwidth of the phase lock loop is to increase the reference frequency. However, increasing the reference frequency produces a more coarse resolution for the PLL. In order to achieve finer resolution, fractional dividers are used in the feed back of the loop. The fractional dividers, however, produce low frequency spurs, when dividing the output of a voltage controlled oscillator (VCO). These low frequency spurs may be reduced in the fractional divider itself. However, In order to mitigate the regeneration of these low frequency spurs, phase detector having a linear transfer characteristic is necessary. Additionally, in some applications where fractional dividers are used, the narrow lock range of the VCO and the frequency range within which the PLL must operate makes frequency steering a necessity.

A digital phase detector comprises an integral part of a digital phase lock loop system. The digital phase detector provides an output, which is characterized by the phase difference between a first reference frequency signal and a second divided VCO signal. Dual state phase detectors and tri-state phase detectors are widely used in digital PLLs.

A tri-state phase detector provides an output that has three conditions corresponding to a positive phase difference, a negative phase difference and a zero phase difference between the first and second input signals. Therefore, the tri-state phase detector provides frequency steering. However, a tri-state phase detector does not provide the necessary linearity in the phase difference detecting range.

A dual state phase detector provides an output having a duty cycle which is characterized by the phase difference between the first and second input signals. When the first and the second input signals are equal in frequency and 180 degrees out of phase, a 50% duty cycle at the output is provided. In practice the duty cycle of the output of the phase detector can be converted to a physical parameter such as current. Generally, a dual state phase detector acts linearly within a phase difference detecting range of 360 degrees. This can be illustrated by referring to the graph 100' shown in FIG. 1. The horizontal axis in the graph 100' represents the phase difference between the first and the second input signals, and the vertical axis represents the output of the phase detector expressed as current. A phase difference of 0 degrees may be represented by a finite current of −1, and a phase difference of 360 degrees may be represented by a finite current of +1. Accordingly, a phase difference of 180 degrees provides a zero current. As can be seen the output of the phase detector acts linearly from 0 degrees to 360 degrees, and crosses the zero point at 180 degrees. A major disadvantage of a dual state phase detector is its inability to steer the frequency in the correct direction. This is shown by considering the phase difference moving from point A to point B, when the phase difference exceeds 360 degrees. Under this condition the phase detector output acts non-linearly, and reverses the sign of the output, thereby steering the frequency in the opposite direction. Accordingly, since the phase detector skips detection of a full cycle on one of the input signals, a "cycle skip" occurs.

Therefor, it is desired to provide a linear phase detector having frequency steering capability.

SUMMARY OF THE INVENTION

Accordingly, it is an object of the present invention to provide a dual state phase detector having frequency steering capability.

Briefly, according to the invention, a phase detector is provided for detecting the phase difference between a first and a second input signal and providing an output corresponding thereto.

The phase detector of the invention comprise a first and a second dual state phase detector for detecting the phase difference between a first input signal and a second input signal, and providing an output corresponding thereto. Each dual state phase detector has a predetermined phase difference detection range, within which it can provide a linear response. The first dual state phase detector detects the phase difference between the first and second input signals, and includes a first indicating means to indicate, when the first dual state phase detectors predetermined phase detecting range is exceeded. The second phase detector compares the phase difference between the second input signal and the inverse of the first input signal, and includes a second indicating means to indicate, when the predetermined phase detecting range of the second dual state phase detector is exceeded. The phase detector of the invention includes means for selecting the output of the first phase detector responsive to the first and the second indicating means, to select the output of the first dual state phase detector, when the predetermined range of the second phase detector is exceeded, and to select the output of the second dual state phase detector when the predetermined range of the first phase detector is exceeded.

DETAILED DESCRIPTION OF THE PREFERRED EMBODIMENT

Figure 2:
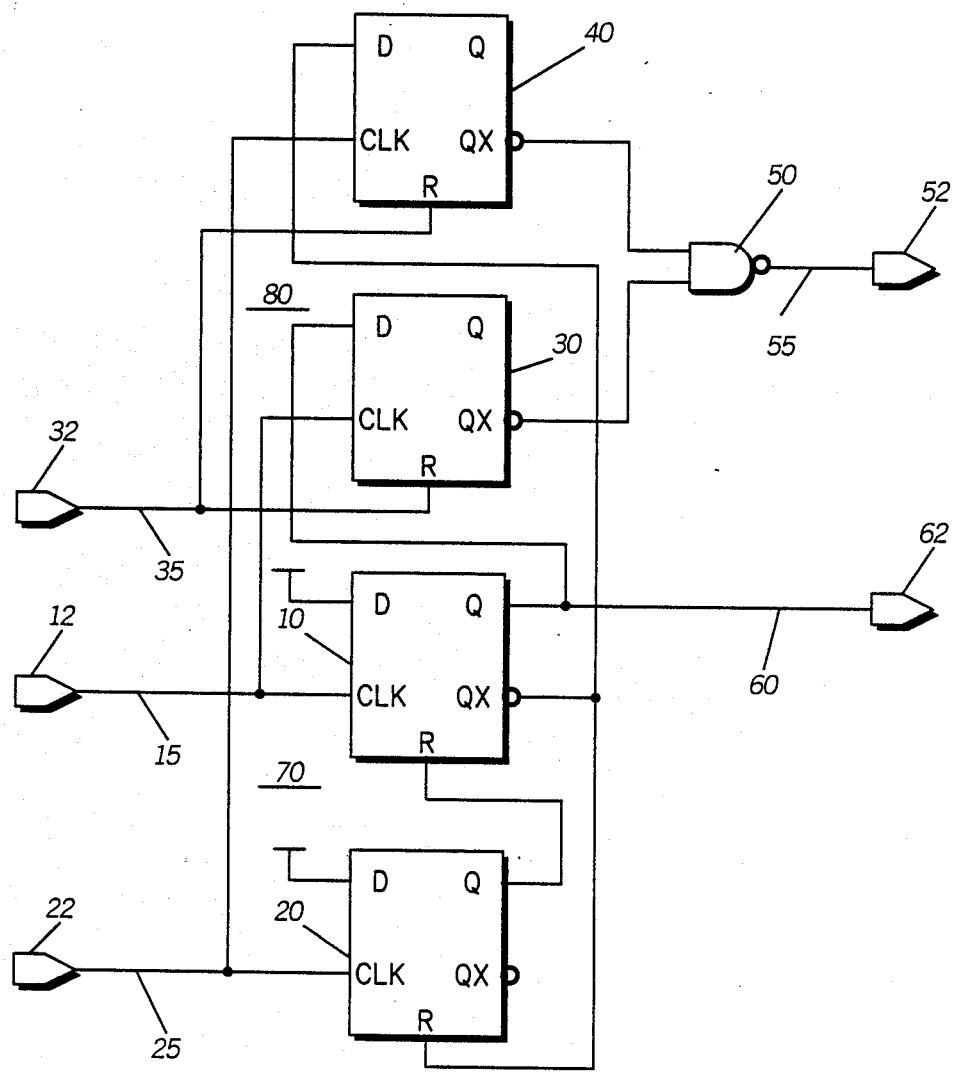
FIG. 2 is the schematic diagram of a dual state phase detector used in the phase detector of the invention.

Referring to FIG. 2, a schematic diagram of a preferred dual state phase detector 100 is shown. The phase detector 100 is a conventional dual state phase detector, which has a cycle skip indicator. A brief description of the operation of the phase detector 100 is provided below.

Basically, phase detector 100 comprises two sections: a phase detecting section 70, and a cycle skip indicator section 80. The phase detecting section 70 comprises D flip-flops 10 and 20, and the cycle skip indicator section 80 comprises D flip-flops 30 and 40. In the preferred embodiment of the invention, the flip-flops 10, 20, 30, and 40 are edge triggered flip-flops, and respond to a leading edge transition at their clock (CLK) input. A logic high or a logic low in the preferred embodiment may be any suitable voltage potential, such as +5 V for a logic high and OV for a logic low. A logic high at the rest (R) input will provide a logic low at the Q output, and a logic high at the QX output of the flip-flop. A first digital signal 15, which may be reference frequency signal for a PLL circuit, is received at a terminal 12, and is applied to the clock inputs of the flip-flops 10 and 30. A second digital signal 25, which may be a divided down VCO signal, is received at a terminal 22, and is applied to the clock inputs of the flip-flops 20 and 40. The D inputs of the flip-flops 10 and 20 are coupled to a logic high.

Operation of phase detecting section 70 may be best understood by assuming that the phase difference between the leading edge of the first input signal 15 and the second input signal 25 is less than 360 degrees, and that the leading edge of the first signal 15 occurs before the leading edge of the second signal 25. Under this condition, the second signal 25 has only one leading edge occurring within one cycle of the first signal 15. In this case, the leading edge of the first signal 15 forces the Q output 60 of the flip-flop 10 to a logic high. The QX output of flip-flop 10 presents a logic low to the reset input of flip-flop 20. Upon the occurrence of the leading edge of the second signal 25, a logic high on the Q output of the flip-flop 20 resets the flip-flop 10 and forces the output 60 to a logic low. Accordingly, the duty cycle of the output 60, which is present at a terminal 62, is proportional to the phase difference between the first and second signals. Moreover, a logic high on the QX output of the flip-flop 10 resets the flip-flop 20 forcing the Q output of this flip-flop to a logic low. The logic low on the Q output of the flip-flop 20 allows the flip-flop 10 to be responsive to the subsequent leading edge of the first signal 15. This configuration allows the phase detecting section 70 to be responsive to the leading edge transition, and not to be affected by the pulse width of the first and second input signals 15 and 25.

Cycle skip indicator section 80 provides a cycle skip indicator output 55 at a terminal 52. The cycle skip occurs when the phase difference between the first and the second signals exceeds 360 degrees. Under this condition, if a leading edge transition of second signal 25 does not occur within one cycle of first signal 15, a logic high is provided on the cycle skip output 55. Additionally, occurrence of more than one leading edge transition of second input signal 25 within one cycle of the first input signal 15 provides a logic high on the cycle skip indicator output 55. Operation of the cycle skip indicator section 80 may be best understood by assuming that, at any time, the leading edge of the second input signal occurs before the leading edge of the first input signal, and that two consecutive leading edges of the first input signal occur within one cycle of second input signal. The leading edge of the second input signal 25 provides a logic low at the D input of the flip-flop 30. The first leading edge of the input signal 15 provides a logic high at the QX output of the flip-flop 30, and a logic high at its D input. Since the leading edge of the input signal 25 has not occurred, the logic high remains at the D input of the flip-flop 30. Thus, when the second leading edge of the first input signal occurs, the QX output of the flip-flop 30 will go to a logic low. The logic low at the input of the NAND gate 50, provides a logic high to the cycle skip indicator output 55. Therefore, the flip-flop 30 detects the occurrence of two or more consecutive leading edges of the first input signal within one cycle of second input signal, and provides a logic high at the terminal 52.

In a similar manner, the flip-flop 40 detects the occurrence of two or more consecutive leading edges of the second input signal 25 within one cycle of first input signal 15. This results in a logic high being provided at the cycle skip indicator output 55, when a cycle skip is detected by the phase detector 100. A reset signal 35 is provided to reset the cycle skip output 55. A logic high at the reset signal 35, applied to a terminal 32, provides the inputs of the NAND gate 50 with logics high, thereby producing a logic low at the terminal 52.

Figure 1:
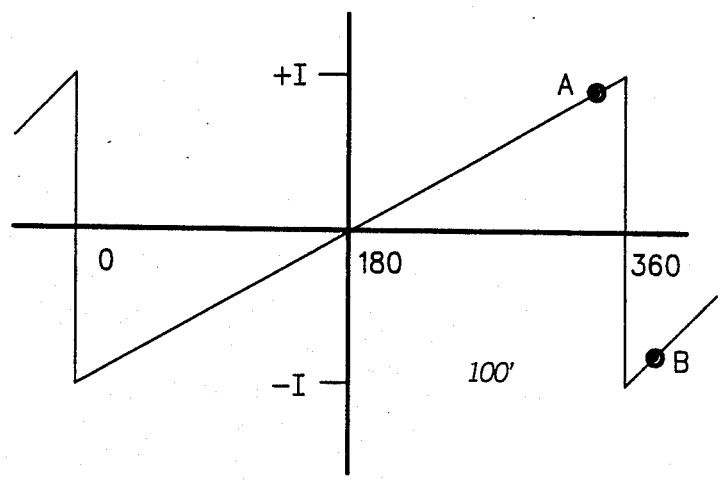
FIG. 1 is a graph of the transfer curve of a conventional dual state phase detector not having frequency steering capability.

The phase difference vs output characteristic of the phase detector may be understood by referring to the graph 100' of FIG. 1. The output is shown to assume a finite values of −1 for a zero phase difference, and vary linearly to assume a finite value of +1 for a 360 degree phase difference. Once the phase difference has exceeded the phase detecting range of 360 degrees (detecting a cycle skip) the output becomes non-linear and reverses its sign.

Figure 3:
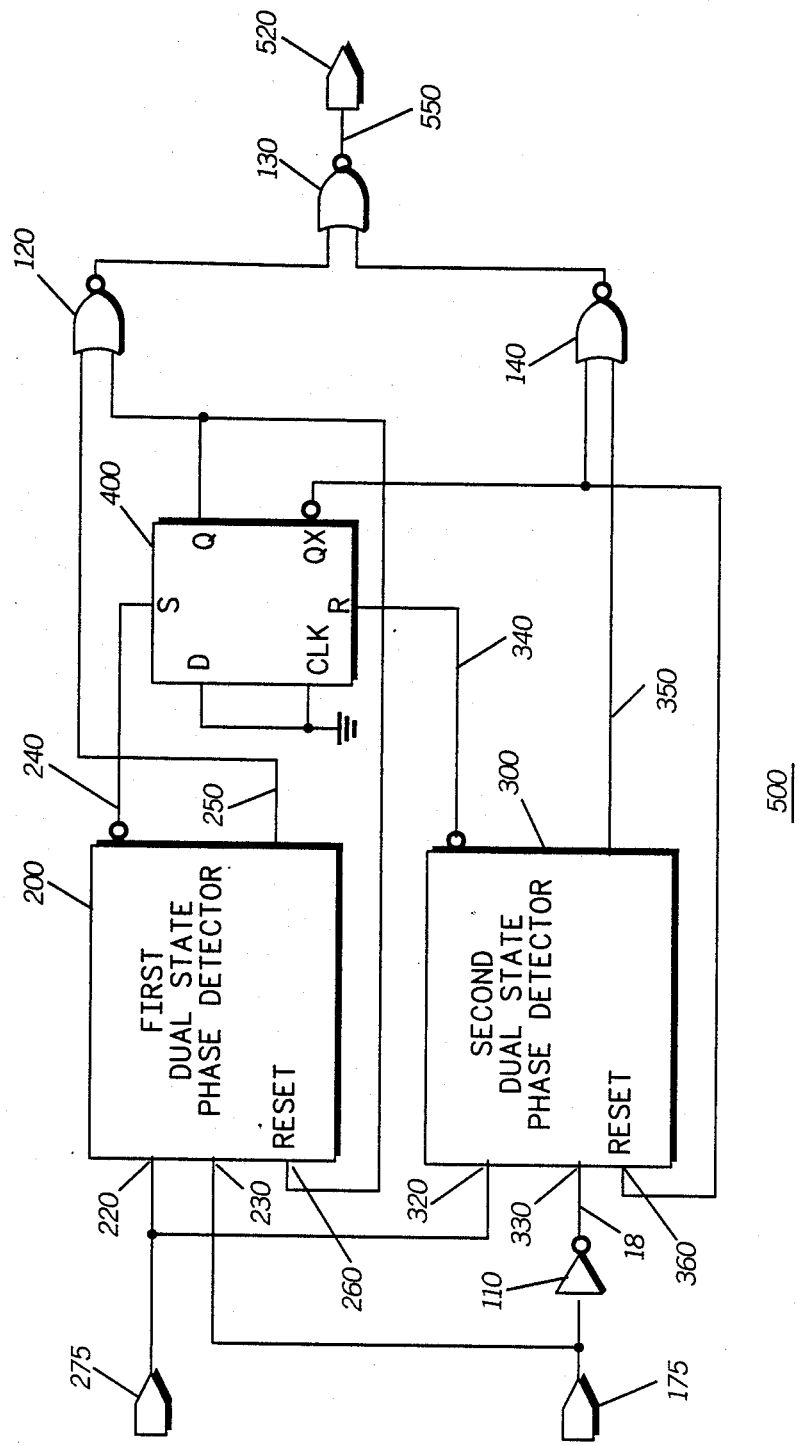
FIG. 3 is the schematic diagram of the phase detector according to the present invention.

Referring to FIG. 3, a phase detector 500 according to the preferred embodiment of the invention is shown. The phase detector 500 provides a phase detector output signal 550, proportional to the phase difference between the first input signal 175 and the secoind input signal 275. The phase detector 500 comprises a first dual state phase detector 200 and a second phase detector 300, each being identical to the phase detector 100 of FIG. 2. Accordingly, the first dual state phase detector 200, and the second dual state phase detector 300 constitute the first phase detecting means and the second phase detecting means, respectively. The dual state phase detector 200 receives the first input signal 175 at a terminal 220, and the second input signal 275 at a terminal 230, and provides a first phase difference signal 250. An inverter 110, constituting the inverting means, receives the first input signal 175 and provides the inverse 18 of the first input signal 175. The dual state phase detector 300 receives the second input signal 275 and the inverse 18 of the first input signal 175, and provides a second phase difference signal 350. In the preferred embodiment of the invention, the first input signal is a digital signal having a 50% duty cycle. Accordingly, the combination of the duty cycle requirement and the inverted first input signal provides the first and second phase error signals with a 180 degree phase difference. Additionally, a cycle skip at the first dual state phase detector 200 produces a logic high for a first cycle skip indicator signal 240. A cycle skip at the dual state phase detector 300 produces a logic high for a second cycle skip indicator signal 340. A RS flip-flop 400 receives the first and second cycle skip indicator signal 240 and 340 at its S and R inputs, respectively.

Figure 4:
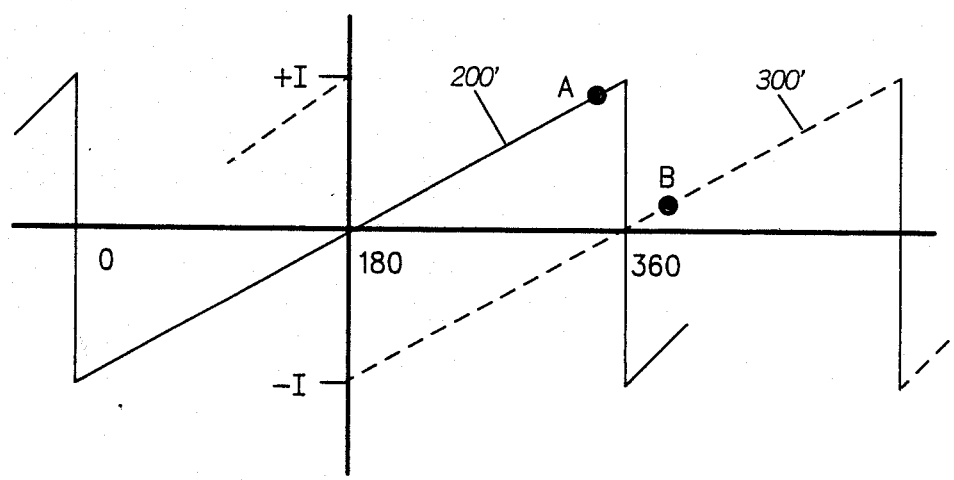
FIG. 4 is a graph of the transfer curve of two dual state phase detector having outputs with a 180 degree phase difference.

Referring to FIG. 4, two graph 200' and 300' illustrates the phase difference vs output relationship of the dual state phase detectors 200 and 300 respectively. The graph 200' is similar to the graph 100' of FIG. 1, where a cycle skip is detected beyond the linear phase detecting range, and the sign of the output is changed. The graph 300' shows a similar characteristic, but has a 180 degree phase shift, which is provided by the dual state phase detector 300. By detecting the cycle skip from one of the phase detectors, the output of the other phase detector may be selected. Thus, the sign of the output will remain in the correct polarity. Correct direction for steering the frequency is thereby achieved.

Referring back to FIG. 3, the operation of the phase detector 500 may be best understood by assuming that the phase difference of the fist input signal 175 and the second input signal 275 is such that no cycle skipping has occurred, (i.e. the phase difference is within 360 degrees), and that the output 250 of the dual state phase detector 200 is selected and routed to the phase detector output 520. Under this condition, the signals 240 and 340 are at a logic low, and the Q output of the flip-flop 400 enables a NOR gate 120 to provide the first phase detector signal 250 at the phase detector output 520 through a NOR gate 130. The logic high at the QX output of the flip-flop 400 forces the second cycle skip indicator signal 340 to be disabled. Accordingly, a NOR gate 140 is also disabled, and provides a logic low at the input of the NOR gate 130. Upon detection of a cycle skip by the phase detector 200, a logic high at the S input of the flip-flop 400 causes a logic high at the Q output of the flip-flop 400. The logic high at the Q output of the flip-flop 400 disables the NOR gate 120, and presents a logic high to the RESET terminal 260 of the phase detector 200. The logic high on the RESET terminal 260 stops the first phase detector 200 from detecting a cycle skip. The logic low on the QX output of flip-flop 400 enables the NOR gate 140, thereby allowing the second phase detector output 350 to be presented at the phase detector output 520. The logic low of the QX output of the flip-flop 400 on the RESET terminal 360 of the second phase detector 300 provides a logic low on the R input of the flip-flop 400, and allows the second phase detector 300 to detect a cycle skip. The logic high on the RESET terminal 260 of the first phase detector 200 will remain high until a cycle skip is detected by the phase detector 300. Upon detection of a cycle skip by the second phase detector 300, the R input of the flip-flop 400 will go to a logic high, and will provide a logic low at the Q output of the flip-flop 400.

The logic low at the Q output of the flip-flop 400 allows the first phase detector output 250 to be presented at the phase detector output 520. The logic low, provided at the RESET terminal 260, allows the phase detector 200 to detect a cycle skip again. Accordingly, the flip-flop 400, and NOR gates 120, 130 and 140 constitute the selecting means for the first phase detector output 250 and the second phase detector output 350.

Accordingly, the phase detector 500 provides a dual state phase detector having frequency steering capability. This capability is provided by detecting a cycle skip and providing one of the two phase difference signals that are complements of each other.

What is claimed is:

1. A phase detector for detecting the phase difference between a first input signal and a second input signal, comprising:

a first phase detecting means having a first predetermined phase detecting range for detecting the phase difference between said first input signal and said second input signal, to provide a first phase difference signal, said first phase detecting means including a first indicating means to indicate when said first predetermined phase detecting range is exceeded;

means for inverting said first input signal to provide a inverse of said first input signal;

a second phase detecting means having a second predetermined phase detecting range for detecting the phase difference between said second input signal and said inverse of said first input signal, to provide a second phase difference signal, said second phase detecting means including a second indicating means to indicate when said second predetermined phase detecting range is exceeded;

selecting means coupled to said first and second phase detecting means, said selecting means receives said first and second phase difference signals and is responsive to said first and second indicating means for selecting said first phase difference signal when said second predetermined phase detecting range is exceeded, and for selecting said second phase difference signal when said first predetermined phase detecting range is exceeded.

2. The phase detector of claim 1, wherein said first input signal and said second input signals comprise binary signals.

3. The phase detector of claim 2, wherein said first input signal has a substantially 50% duty cycle.

4. The phase detector of claim 2, wherein said means for inverting said first input signal is a binary inverter.

5. The phase detector of claim 2, wherein said first and said second phase detecting means are edge triggered.

6. The phase detector of claim 1, wherein said predetermined first and second ranges are substantially 360 degrees.

* * * * *